US008906246B2

(12) United States Patent
Kato et al.

(10) Patent No.: US 8,906,246 B2
(45) Date of Patent: Dec. 9, 2014

(54) FILM DEPOSITION APPARATUS AND FILM DEPOSITION METHOD

(75) Inventors: Hitoshi Kato, Iwate (JP); Takeshi Kumagai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 100 days.

(21) Appl. No.: 13/430,871

(22) Filed: Mar. 27, 2012

(65) Prior Publication Data

US 2012/0267341 A1    Oct. 25, 2012

(30) Foreign Application Priority Data

Mar. 29, 2011    (JP) ................................. 2011-073193

(51) Int. Cl.
| C23C 16/56 | (2006.01) |
| H01L 21/02 | (2006.01) |
| C23C 16/04 | (2006.01) |
| C23C 16/40 | (2006.01) |
| C23C 16/455 | (2006.01) |

(52) U.S. Cl.
CPC ...... *H01L 21/0228* (2013.01); *H01L 21/02164* (2013.01); *H01L 21/0234* (2013.01); *C23C 16/045* (2013.01); *C23C 16/402* (2013.01); *C23C 16/45534* (2013.01); *C23C 16/4554* (2013.01); *C23C 16/45551* (2013.01)
USPC .... 216/37; 438/689; 156/345.44; 156/345.55

(58) Field of Classification Search
None
See application file for complete search history.

(56) References Cited

U.S. PATENT DOCUMENTS

| 6,565,759 | B1 * | 5/2003 | Chen et al. ........................ 216/6 |
| 7,049,211 | B2 * | 5/2006 | Karim et al. ................... 438/582 |
| 7,205,242 | B2 * | 4/2007 | Ryu ............................... 438/706 |
| 7,482,247 | B1 * | 1/2009 | Papasouliotis et al. ........ 438/437 |
| 7,745,350 | B2 * | 6/2010 | Wang et al. .................... 438/788 |
| 7,867,921 | B2 * | 1/2011 | Wang et al. .................... 438/787 |
| 7,910,491 | B2 * | 3/2011 | Soo Kwon et al. ............ 438/738 |
| 7,972,968 | B2 * | 7/2011 | Lee et al. ....................... 438/711 |
| 8,148,267 | B2 * | 4/2012 | Cho et al. ....................... 438/704 |
| 2003/0045113 | A1 * | 3/2003 | Enomoto et al. .............. 438/706 |
| 2003/0136332 | A1 * | 7/2003 | Krishnaraj et al. .............. 117/92 |
| 2004/0026374 | A1 | 2/2004 | Nguyen et al. |
| 2004/0251236 | A1 * | 12/2004 | Zhang et al. ..................... 216/67 |
| 2005/0124166 | A1 * | 6/2005 | Krishnaraj et al. ............ 438/694 |
| 2006/0128167 | A1 * | 6/2006 | Nakata et al. ................. 438/795 |

(Continued)

FOREIGN PATENT DOCUMENTS

| JP | 2003-142484 | 5/2003 |
| JP | 2010-027648 | 2/2010 |

(Continued)

*Primary Examiner* — Allan Olsen
(74) *Attorney, Agent, or Firm* — IPUSA, PLLC

(57) ABSTRACT

A film deposition method includes steps of transferring a substrate having a pattern including a concave part into a vacuum chamber; supplying a first reaction gas to the substrate from a first reaction gas supplying part, thereby allowing the first reaction gas to be adsorbed on the substrate; supplying a second reaction gas that reacts with the first reaction gas to the substrate from a second reaction gas supplying part, thereby allowing the first reaction gas adsorbed on the substrate to react with the second reaction gas and forming a reaction product of the first and the second reaction gases on the substrate; supplying an alteration gas to the substrate through an activated gas supplying part capable of activating the alteration gas; and supplying an etching gas to the substrate chamber through the activated gas supplying part under an environment where the reaction product is not formed.

12 Claims, 13 Drawing Sheets

(56) References Cited

U.S. PATENT DOCUMENTS

2006/0286764 A1\* 12/2006 Zhang et al. .................. 438/424
2010/0260935 A1    10/2010 Kato et al.
2012/0012969 A1\*  1/2012 Park et al. ..................... 257/503

FOREIGN PATENT DOCUMENTS

| | | |
|---|---|---|
| JP | 2010-56470 | 3/2010 |
| JP | 2010-087475 | 4/2010 |
| JP | 2010-245448 A | 10/2010 |

\* cited by examiner

FILM DEPOSITION APPARATUS AND FILM DEPOSITION METHOD

CROSS-REFERENCE TO RELATED APPLICATION

The present application is based on Japanese Patent Application No. 2011-073193 filed with the Japanese Patent Office on Mar. 29, 2011, the entire contents of which are hereby incorporated herein by reference.

BACKGROUND OF THE INVENTION

1. Field of the Invention

The present invention relates to a film deposition apparatus and a film deposition method for depositing a film on a substrate by alternately supplying plural reaction gases to a substrate, allowing the reaction gases to react with each other on the substrate, and thus depositing a film formed of a reaction product on the substrate.

2. Description of the Related Art

Along with further miniaturization of circuit patterns in semiconductor devices, various films that constitute the semiconductor devices are demanded to be thinner and more uniform. As a film deposition method capable of responding such demand, a so-called Atomic Layer Deposition (ALD) or Molecular Layer Deposition (MLD) has been drawing attention (for example, Patent Document 1). In such a film deposition method, a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This method is advantageous in highly uniform thickness distribution, highly accurate thickness controllability, and excellent gap-filling characteristic, because the reaction gases can be adsorbed on the wafer in a (quasi-)self-limiting manner.

Patent Document 1: Japanese Patent Application Laid-Open Publication No. 2010-56470.

Patent Document 2: Japanese Patent Application Laid-Open Publication No. 2003-142484.

However, because aspect ratios of a trench for a trench isolation structure and a space of a line-and-space pattern tend to be larger along with further miniaturization of the circuit patterns, it becomes difficult to fill the trench and the space even by the ALD method. For example, when a space having a width of 30 nm is filled with silicon oxide, a film thickness tends to be greater at an upper end part of side walls of the space than at a bottom part of the space, because reaction gases cannot easily proceed toward the bottom part. As a result, a void may be caused in the silicon oxide that fills the space. In this case, when the silicon oxide is etched in the subsequent process step, an opening may be formed in the upper part of the silicon oxide, so that the opening is in communication with the void. If this happens, an etching agent used in the etching process step may flow into the void through the opening, so that the etching agent having flowed into the void may cause contamination in subsequent processes. Alternatively, in a subsequent metallization step, metal may enter the void through the opening of the silicon oxide, so that the metal causes defects.

Such a problem may be caused not only in the ALD method but also in a chemical vapor deposition (CVD) method. For example, when a connection hole formed in a semiconductor substrate is filled with an electrically conductive material thereby forming an electrical connection (i.e., a plug), a void may be caused in the plug. In order to avoid such voids, there has been proposed a method where an over hang part that is formed of the electrically conductive material at an upper part of the connection hole is etched repeatedly while the electrically conductive material is intermittently deposited on the substrate, so that the plug without the void can be obtained (Patent Document 2).

SUMMARY OF THE INVENTION

However, the method proposed in Patent Document 2 is somewhat disadvantageous in that the deposition and the etching of the electrically conductive material need to be carried out in different apparatuses. Therefore, transferring the wafer between the apparatuses is required, and it takes time to stabilize conditions in each of the apparatuses, so that production throughput is reduced.

The present invention has been made in view of the above, and provides a film deposition method and a film deposition apparatus that are capable of filling concave parts formed in a substrate while reducing voids in the concave parts.

According to a first aspect of the present invention, there is provided a film deposition method including steps of transferring a substrate having a pattern including a concave part therein into a vacuum chamber; supplying a first reaction gas to the substrate in the vacuum chamber from a first reaction gas supplying part, thereby allowing the first reaction gas to be adsorbed on the substrate; supplying a second reaction gas that reacts with the first reaction gas to the substrate in the vacuum chamber from a second reaction gas supplying part, thereby allowing the first reaction gas adsorbed on the substrate to react with the second reaction gas and thus forming a reaction product of the first reaction gas and the second reaction gas on the substrate; supplying an alteration gas to the substrate in the vacuum chamber through an activated gas supplying part that is capable of activating the alteration gas, thereby altering properties of the reaction product on the substrate; and supplying an etching gas to the substrate in the vacuum chamber through the activated gas supplying part under an environment where the reaction product is not being formed, thereby etching the reaction product.

According to a second aspect of the present invention, there is provided a film deposition method including steps of transferring a substrate having a pattern including a concave part therein into a vacuum chamber; supplying a first reaction gas to the substrate in the vacuum chamber from a first reaction gas supplying part, thereby allowing the first reaction gas to be adsorbed on the substrate; supplying a second reaction gas that reacts with the first reaction gas to the substrate in the vacuum chamber from a second reaction gas supplying part and allowing the first reaction gas adsorbed on the substrate to react with the second reaction gas, thereby forming a reaction product of the first reaction gas and the second reaction gas on the substrate; and supplying an, alteration gas and an etching gas to the substrate in the vacuum chamber through an activated gas supplying part that is capable of activating the alteration gas, thereby altering and etching the reaction product on the substrate.

According to a third aspect of the present invention, there is provided a film deposition apparatus including a turntable rotatably provided in a vacuum chamber, wherein the turntable includes a substrate receiving part in which a substrate is placed; a first reaction gas supplying part that supplies a first reaction gas to the substrate placed in the substrate receiving part, thereby allowing the first reaction gas to be adsorbed on the substrate; a second reaction gas supplying part that is provided away from the first reaction gas supplying part in a circumferential direction of the turntable and supplies a second reaction gas, thereby allowing the first reaction gas adsorbed on the substrate to react with the second reaction gas and thus forming a reaction product of the first reaction gas and the second reaction gas on the substrate; an activated gas supplying part that is arranged between the first reaction gas supplying part and the second reaction gas supplying part and activates an alteration gas and an etching gas thereby supplying the activated alteration gas and etching gas to the substrate.

DETAILED DESCRIPTION OF THE PREFERRED EMBODIMENT

Figure 1:
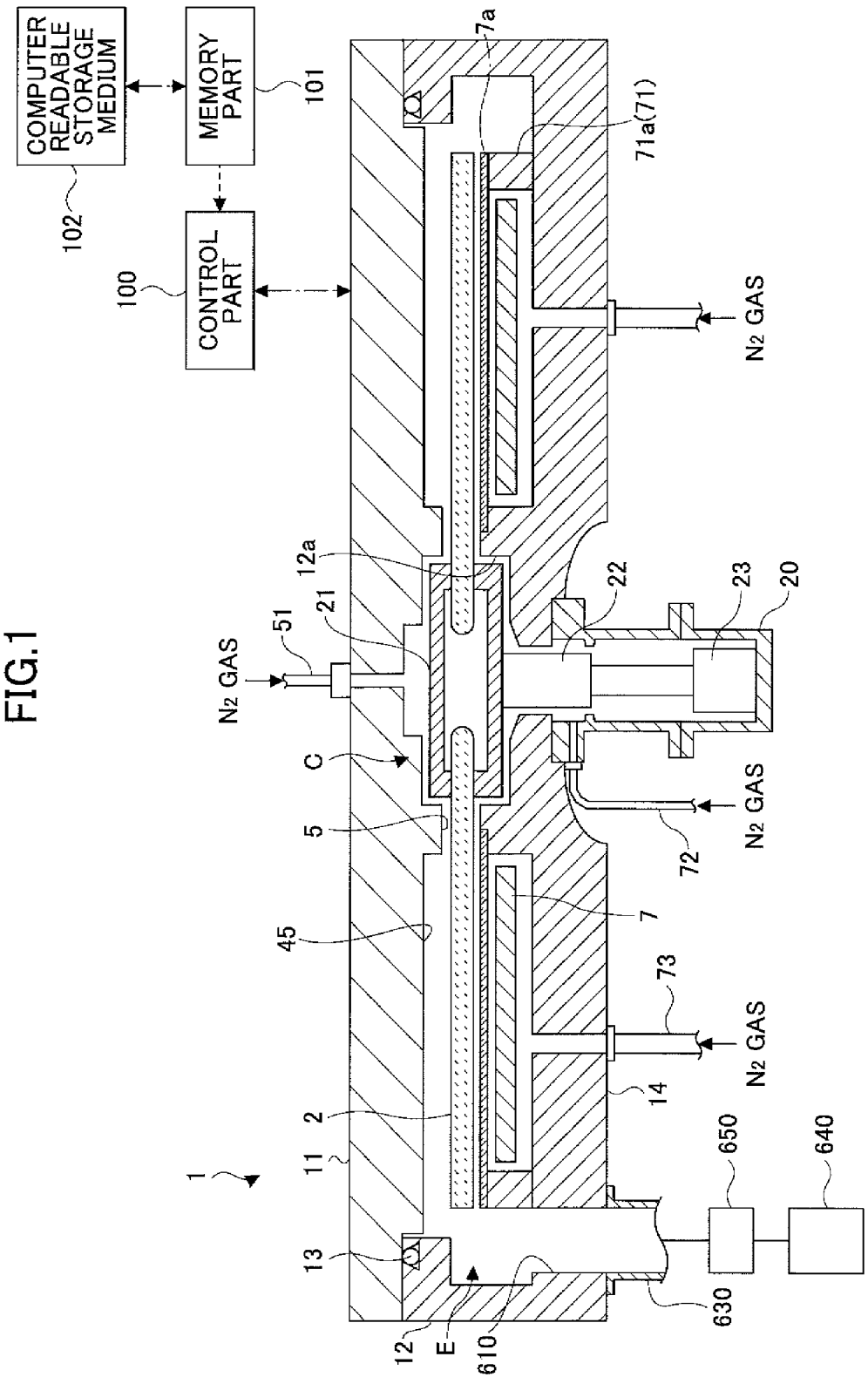
FIG. 1 is a schematic cross-sectional view of a film deposition apparatus according to an embodiment of the present invention.

According to an embodiment of the present invention, there are obtained a film deposition method and a film deposition apparatus that are capable of filling concave parts formed in a substrate while reducing voids in the concave parts.

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

Figure 2:
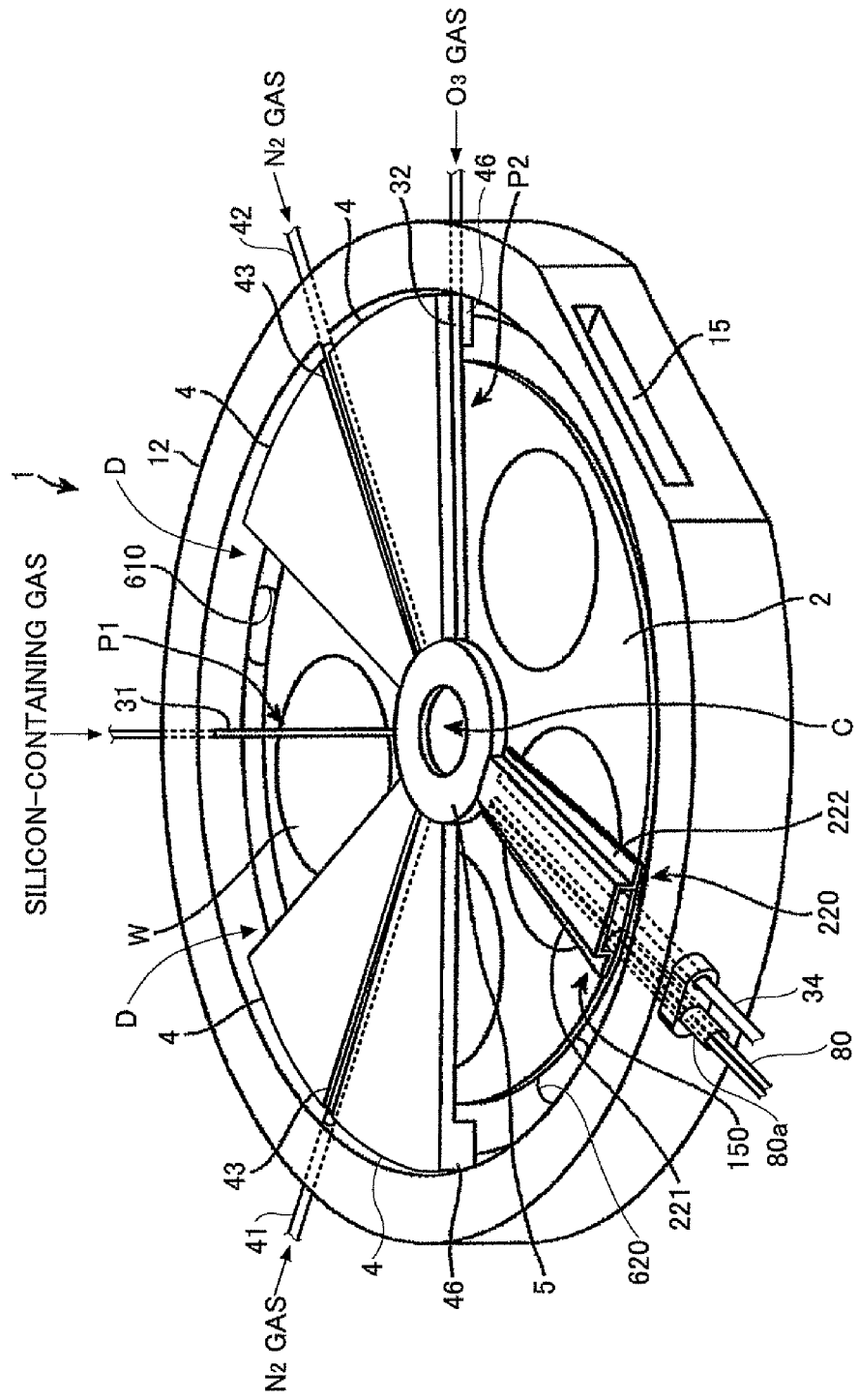
FIG. 2 is a perspective view of the film deposition apparatus of FIG. 1.
Figure 3:
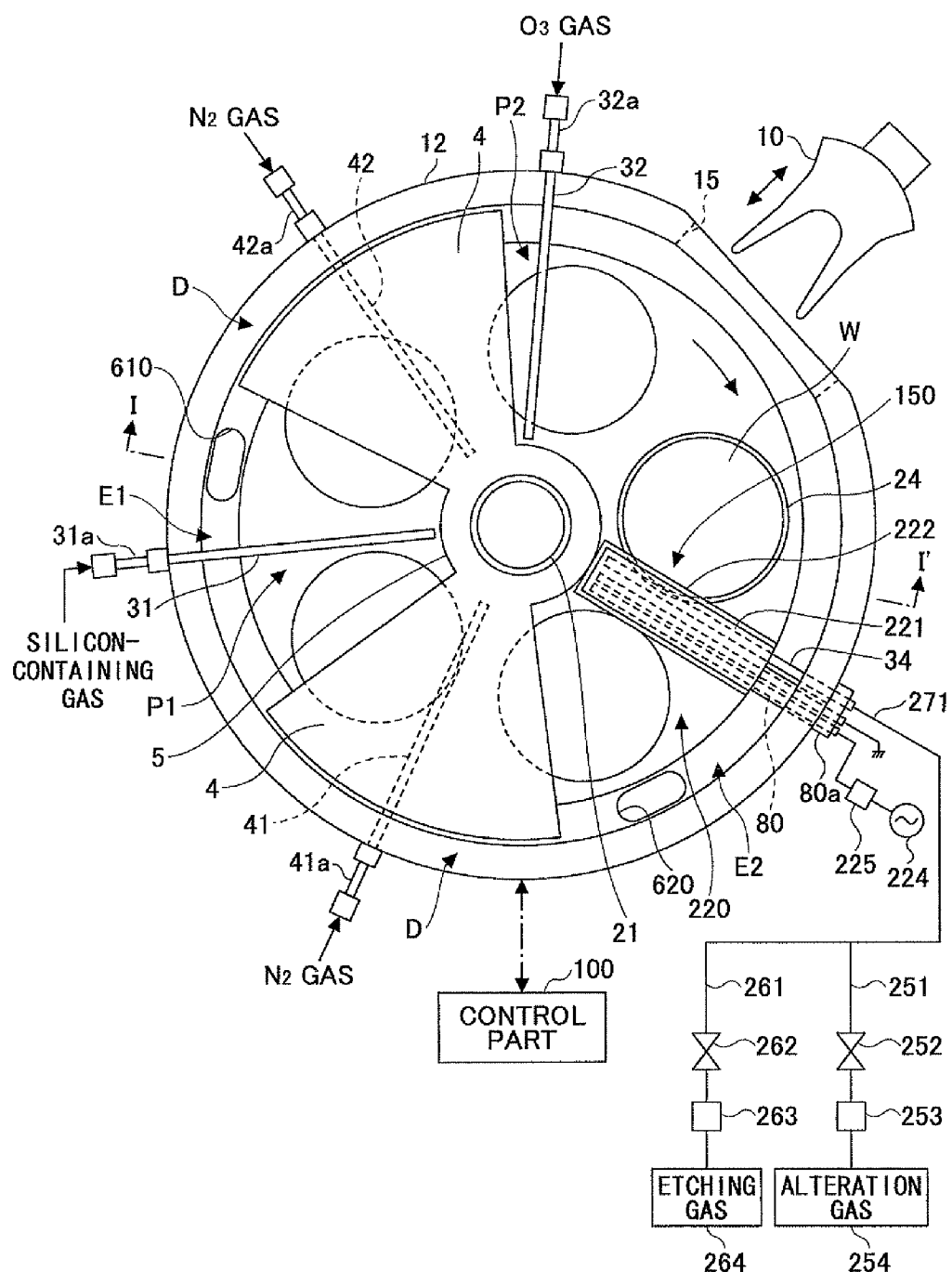
FIG. 3 is a plan view of the film deposition apparatus of FIG. 1.

Referring to FIGS. 1 through 3, a film deposition apparatus according to an embodiment of the present invention is provided with a vacuum chamber 1 having a flattened cylinder shape, and a turn table 2 that is located inside the chamber 1 and has a rotation center at a center of the vacuum chamber 1. The vacuum chamber 1 is composed of a chamber body 12 having a cylindrical shape with a closed bottom and a ceiling plate 11 that is detachably placed on the upper end part of the chamber body 12 via a sealing member such as an O ring 13 (FIG. 1).

The turntable 2 is rotatably fixed onto a cylindrically shaped core portion 21. The core portion 21 is fixed on an upper end of a rotational shaft 22 that extends in a vertical direction. The rotational shaft 22 goes through a bottom part 14 of the chamber body 12 and is fixed at the lower end part to a driving mechanism 23 that can rotate the rotational shaft 22 clockwise (FIG. 3). The rotational shaft 22 and the driving mechanism 23 are housed in a case body 20 having a cylinder shape with a closed bottom. The case body 20 is hermetically fixed to a bottom surface of the bottom part 14, which isolates an inner environment of the case body 20 from an outer environment.

As shown in FIGS. 2 and 3, plural (five in the illustrated example) circular concave portions 24, each of which receives a semiconductor wafer W (referred to as a wafer W hereinafter), are formed in an upper surface of the turntable 2. The concave portions 24 are located along a circumferential direction at equal angular intervals in the turntable 2. Incidentally, only one wafer W is illustrated in FIG. 3. Each of the concave portion 24 has a diameter slightly larger, for example by 4 mm, than the diameter of the wafer W and a depth substantially equal to a thickness of the wafer W. Therefore, when the wafer W is placed in the concave portion 24, a surface of the wafer W is at the same elevation of a surface of an area of the turntable 2, the area excluding the concave portions 24. In the bottom of the concave portion 24 there are formed three through holes (not shown) through which three corresponding elevation pins (see FIG. 8) are raised/lowered. The elevation pins support a back surface of the wafer W and raise and lower the wafer W.

Referring again to FIGS. 2 and 3, a first reaction gas nozzle 31, a second reaction gas nozzle 32, separation gas nozzles 41, 42, and an activated gas injector 220 are provided above the turntable 2, all of which are made of, for example, quartz glass and extend in radial directions and at predetermined angular intervals along the circumferential direction (or a rotational direction). In the illustrated example, the activated gas injector 220, the separation gas nozzle 41, the first reaction gas nozzle 31, the separation gas nozzle 42, and the second reaction gas nozzle 32, are arranged clockwise in this order when seen from above. These gas nozzles 31, 32, 41, 42, and 220 go through a circumferential wall part of the chamber body 12 into an inside of the vacuum chamber 1 along a radius direction to be substantially parallel with the rotation table 2. The gas nozzles 31, 32, 41, 42, and 220 are supported by attaching their base ends, which are gas inlet ports 31a, 32a, 41a, 42a, 220a, respectively, on the outer circumference of the wall part.

Although not shown, the reaction gas nozzle 31 is connected to a gas supplying source of a silicon-containing gas as a first reaction gas via a pipe and a flow rate controller and the like (not shown); the reaction gas nozzle 32 is connected to a gas supplying source of an oxidization gas as a second reaction gas via a pipe and a flow rate controller and the like (not shown); and the separation gas nozzles 41, 42 are connected to a gas supplying source of nitrogen ($N_2$) gas as a separation gas via a pipe and a flow rate controller and the like (not shown).

As the silicon-containing gas, an organic amino-silane gas may be used, for example, and as the oxidization gas, ozone ($O_3$) gas, oxygen ($O_2$) gas and a mixture of these may be used.

The reaction gas nozzles 31, 32 have plural ejection holes 33 (see FIG. 4) to eject the corresponding reaction gases toward the rotation table 2. The plural ejection holes 33 are arranged in longitudinal directions of the reaction gas nozzles 31, 32 at predetermined intervals, for example, about 10 mm. An area below the reaction gas nozzle 31 may be referred to as a first process area 21 in which the silicon-containing gas is adsorbed on the wafer W, and an area below the reaction gas nozzle 32 may be referred to as a second process area P2 in which the silicon-containing gas adsorbed on the wafer W is oxidized by the oxidation gas.

As shown in FIGS. 2 and 3, concave portions 4 each of which protrudes from the lower surface of the ceiling plate 11 toward the rotation table 2 are provided in the vacuum chamber 1. The concave portions 4 constitute corresponding separation areas D that separate the first process area P1 and the second process area P2, together with the corresponding one of the separation nozzles 41, 42. The convex portion 4 has a top view shape of a truncated sector whose inner arc lies along a protrusion part 5 (described later) and whose outer arc lies near and along the inner circumferential wall of the chamber body 12.

Figure 4:
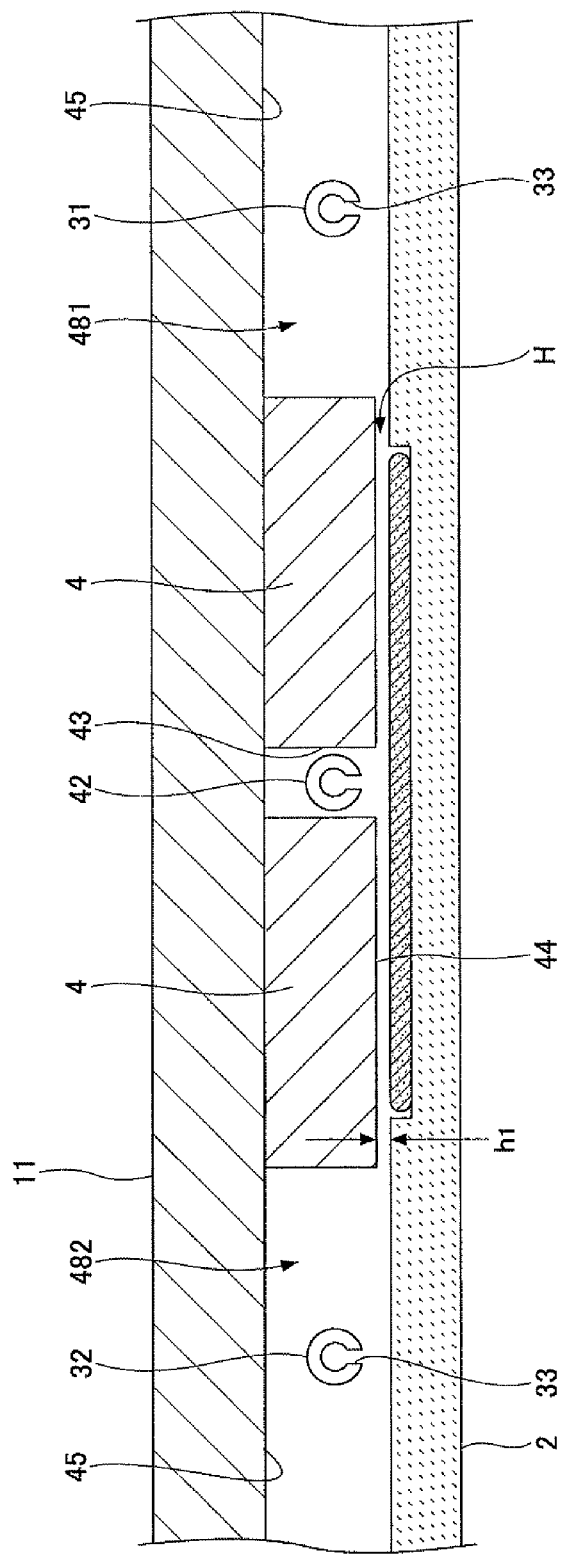
FIG. 4 is a partial cross-sectional view for explaining a separation area in the film deposition apparatus of FIG. 1.

Referring to FIG. 4, which is a cross-sectional view taken along a part of a concentric circle of the rotation table 2 from the first reaction gas nozzle 31 to the second reaction gas nozzle 32, flat lower ceiling surfaces 44 (first ceiling surfaces) are defined by the convex portion 4, and a higher ceiling surfaces 45 (second ceiling surfaces) are defined outside of the corresponding lower ceiling surfaces 44. Each of the lower surfaces 44 has a truncated sector. In addition, the convex portions 4 have corresponding groove portions 43 that extend in the radial directions of the convex portions 4 and house the corresponding separation gas nozzles 41, 42. In addition, the reaction gas nozzles 31, 32 are arranged below the higher ceiling surfaces 45. Specifically, the reaction gas nozzles 31, 32 are arranged away from the higher ceiling surfaces and near the upper surface of the rotation table 2. Incidentally, a space below the higher ceiling surface 45 where the first reaction gas nozzle 31 is arranged may be referred to by a reference symbol 481; and a space below the higher ceiling surface 45 where the second reaction gas nozzle 32 is arranged may be referred to by a reference symbol 482.

The lower ceiling surfaces 44 create a separation space H, which is a thin space in relation to the upper surface of the turntable 2. The separation space H can isolate the silicon-containing gas in the first process area P1 and the oxidization gas in the second process area P2. Specifically, the $N_2$ gas, which is ejected from the separation gas nozzle 42, flows toward the spaces 481, 482 through the separation space H. In this case, a volume of the separation space H is smaller than volumes of the spaces 481, 482, a pressure of the separation space H through which the $N_2$ gas flows can be higher than pressures of the spaces 481, 482. Therefore, a pressure wall can be created between the spaces 481, 482. In addition, the $N_2$ gas flowing from the separation area D to the spaces 481, 482 serves as a counter flow against the silicon-containing gas in the first process area P1 and the oxidization gas in the second process area P2. Therefore, the silicon-containing gas and the oxidization gas rarely flow into the separation area D.

Accordingly, the silicon-containing gas and the oxidization gas are prevented from being intermixed and reacting with each other in the vacuum chamber 1.

As shown in FIGS. 2 and 3, a ring-shaped protrusion portion 5 is provided on a lower surface of the ceiling plate 11 so that the inner circumference of the protrusion portion 5 faces the outer circumference of the core portion 21. The protrusion portion 5 opposes the turntable 2 in an outer area of the core portion 21. In addition, a lower surface of the protrusion portion 5 and a lower surface of the convex portion 4 form one plane surface. In other words, a height of the lower surface of the protrusion portion 5 from the turntable 2 is the same as a height of the lower surface of the convex portion 4.

Incidentally, FIGS. 2 and 3 illustrate the chamber body 12 and the inside thereof as if the chamber body 12 were horizontally severed at a position above the separation gas nozzles 41, 42 and below the higher ceiling surface 45, for the sake of illustration.

Figure 5:
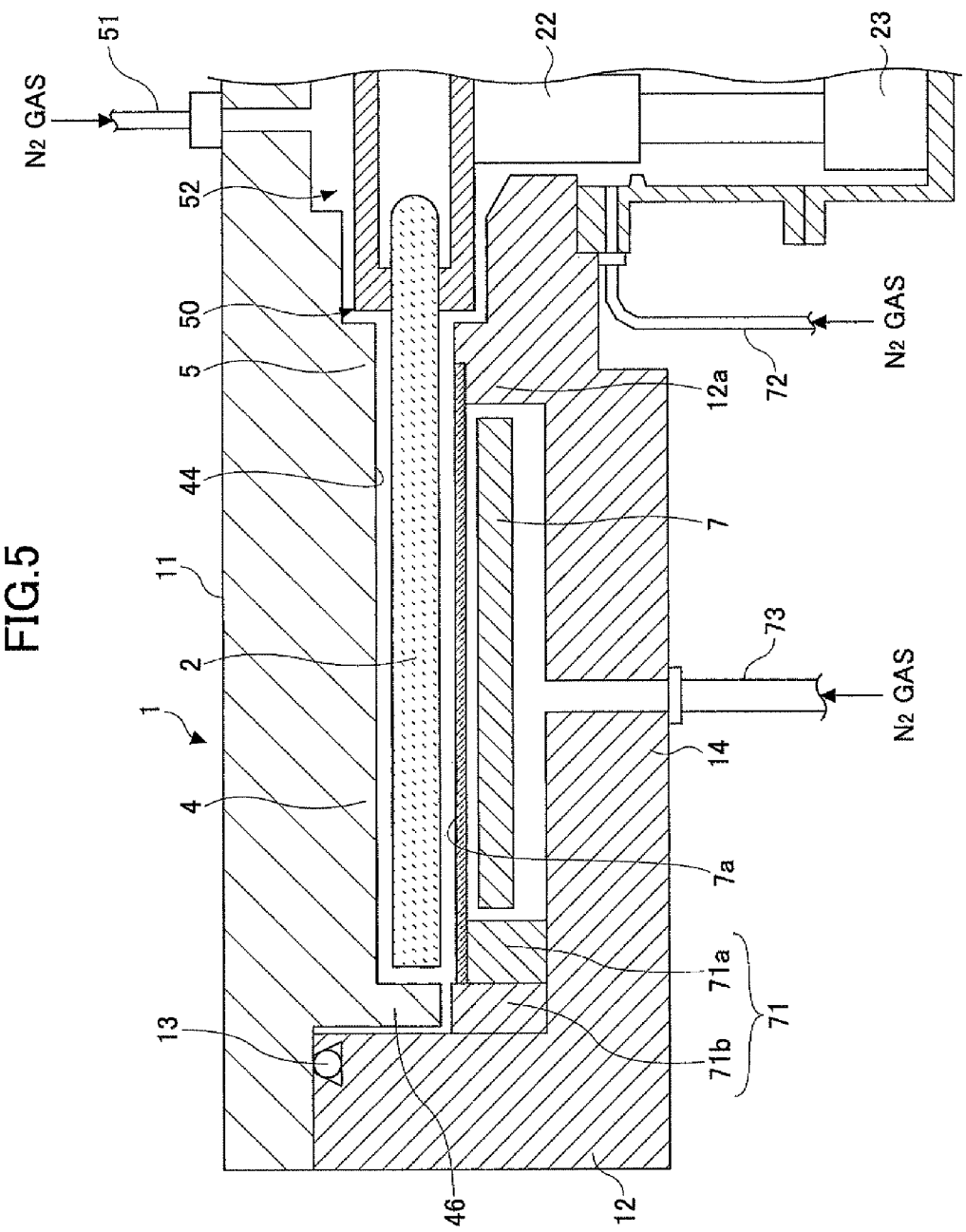
FIG. 5 is another schematic cross-sectional view of the film deposition apparatus of FIG. 1.

FIG. 5 is a cross-sectional view illustrating a part of the vacuum chamber 1 where the lower ceiling surface 44 is provided, while FIG. 1 illustrates a cross-sectional view taken along I-I' line of FIG. 3, where the higher ceiling surface 45 is provided. As shown in FIG. 5, a bent portion 46 is provided at the outer circumference part of the convex portion 4, so that the bent portion 46 is arranged between the outer circumference of the turntable 2 and the inner circumferential wall of the chamber body 12. The bent portion 46 prevents the silicon-containing gas and the oxidization gas from being intermixed through a space between the turntable 2 and the inner circumferential wall of the chamber body 12. Because the convex portion 4 is attached on the lower surface of the ceiling plate 11, which can be removed from the chamber body 12, there needs to be a clearance between an outer circumferential wall of the bent portion 46 and the inner circumferential wall of the chamber body 12 and between an inner circumferential wall of the bent portion 46 and the circumference of the turntable 2. The clearance may be set to be the same as the height h1 of the lower ceiling surface 44 with respect to the turntable 2.

The inner circumferential wall of the chamber body 12 provides a vertical surface closer to the outer circumferential surface of the bent portion 46 in the separation area D, as shown in FIG. 5, and is indented in a range from a position opposing the outer circumference of the turntable 2 to the bottom part 14 of the chamber body 12 in an area except for the separation area D, as shown in FIG. 1. In the following description, the indented part having substantially a rectangular cross-sectional shape may be referred to as an evacuation area, for the sake of explanation. Specifically, an evacuation area that is in gaseous communication with the first process area P1 is referred to as a first evacuation area E1; and an evacuation area that is in communication with the second process area P2 is referred to as a second evacuation area E2. In bottom parts of the first evacuation area E1 and the second evacuation areas E2, a first evacuation port 610 and a second evacuation port 620 are formed, respectively, as shown in FIGS. 1 through 3. The first evacuation port 610 and the second evacuation port 620 are connected to a vacuum pump 640 serving as an evacuation apparatus via corresponding evacuation pipes 630, as shown in FIG. 1. Incidentally, a reference symbol 650 is a pressure controller.

As shown in FIGS. 1 and 5, a ring-shaped heater unit 7 serving as a heating portion is provided in a space between the turntable 2 and the bottom part 14 of the chamber body 12, so that the wafers W placed on the turntable 2 are heated through the turntable 2 at a temperature (e.g., 450° C.) determined by a process recipe. In addition, a cover member 71 is provided below and near the outer circumference of the turntable 2 in order to substantially surround the space where the heater unit 7 is placed, thereby preventing gases from entering the space where the turntable 2 is placed (FIG. 5). Specifically, the cover member 71 includes an inner member 71a and an outer member 71b. The inner member 71a is arranged below and along the outer circumference of the turntable 2; and the outer member 71b is arranged between the inner member 71a and the inner circumferential surface of the chamber body 12. Specifically, the inner member 71a surrounds the entire space where the heater unit 7 is placed; and the outer member 71b is placed in the separation areas D thereby opposing the bent portions 46 formed on the outer circumference part of the convex portion 4.

The bottom part 14 includes a protrusion part 12a that protrudes toward the core portion 21 arranged near the center of the lower surface of the turntable 2. A narrow space is formed between the protrusion part 12a and the core portion 21. In addition, there is formed a gap between the rotational shaft 22 and the inner circumferential surface of the through hole that allows the rotational shaft 22 to pass therethrough. The narrow space and the gap are in gaseous communication with the case body 20. To the case body 20, a purge gas supplying pipe 72 is connected to supply a purge gas thereby purging the inside of the case body 20, the gap, and the narrow space. In addition, plural purge gas supplying pipes 73 are connected at predetermined angular intervals to areas below the heater unit 7 in order to purge the space where the heater unit 7 is placed. Incidentally, only one purge gas supplying pipe 73 is illustrated in FIG. 5 for the sake of illustration. In addition, a lid member 7a is provided between the turntable 2 and the heater unit 7. The lid member 7a has substantially a shape of a ring and is made of, for example, quartz glass. In addition, the lid member 7a is supported at the outer circumferential part of the lid member 7a by the inner member 71a and at a part near the inner circular opening of the lid member 7a by the protrusion part 12a. Therefore, the lid member 7a covers the space where the heater unit 7 is placed and thus prevents the heater unit 7 from being exposed to gases except for the purge gas supplied from the purge gas supplying pipes 73.

In addition, a separation gas supplying pipe 51 is connected to the top center portion of the ceiling plate 11 of the vacuum chamber 1, so that $N_2$ gas as a separation gas is supplied to a space 52 between the ceiling plate 11 and the core portion 21. The separation gas supplied to the space 52 flows through the thin gap 50 between the protrusion portion 5 and the turntable 2 and then along the upper surface of the turntable 2 toward the outer circumference of the turntable 2. The thin space 50 can be maintained by the $N_2$ gas at a higher pressure than pressures in the spaces 481, 482. Therefore, the silicon-containing gas supplied to the first process area P1 and the oxidization gas supplied to the second process area 92 are prevented from being intermixed with each other through the center area C by the thin space 50 maintained at a higher pressure. In other words, the thin space 50 (or the center area C) functions in the same manner as the separation space H (or the separation area D).

In addition, a transfer opening 15 is formed in a side wall of the chamber body 12 as shown in FIGS. 2 and 3. Through the transfer opening 15, the wafer W is transferred into or out from the vacuum chamber 1 by a transfer arm 10 (FIGS. 3 and 8). The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 as a wafer receiving portion of the turntable 2 from the transfer arm 10. In order to lower/raise the wafer W into/from the concave portion 24, there are provided elevation pins 16 that are raised or lowered through corresponding through holes formed in the concave portion 24 of the turntable 2 by an elevation mechanism (not shown).

Figure 6:
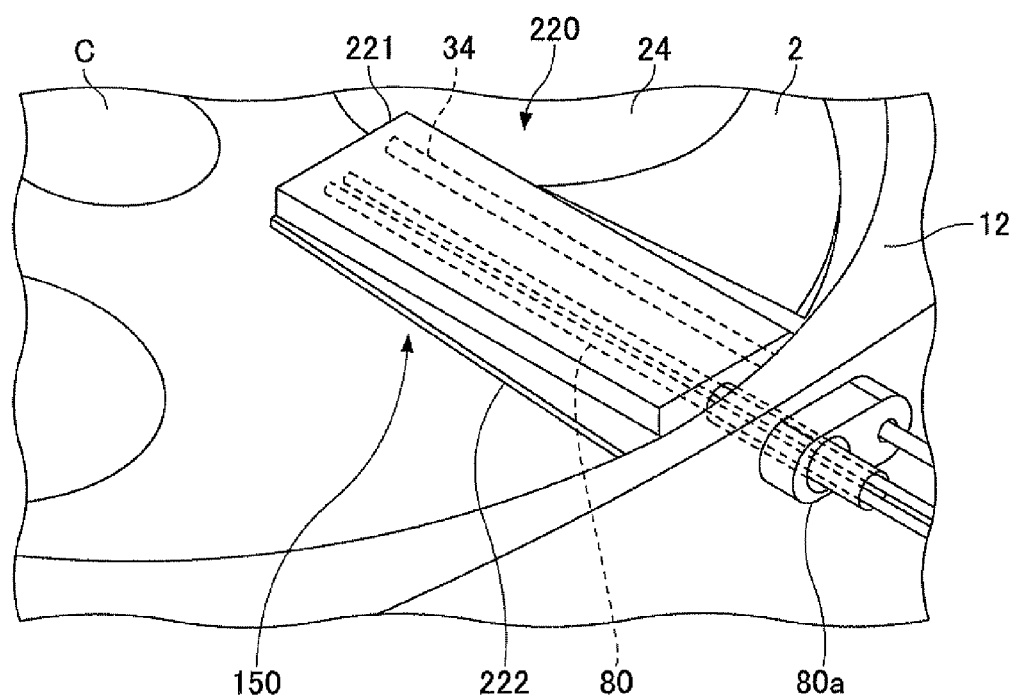
FIG. 6 is a schematic cross-sectional view illustrating an example of an activated gas supplying part provided in the film deposition apparatus of FIG. 1.
Figure 7:
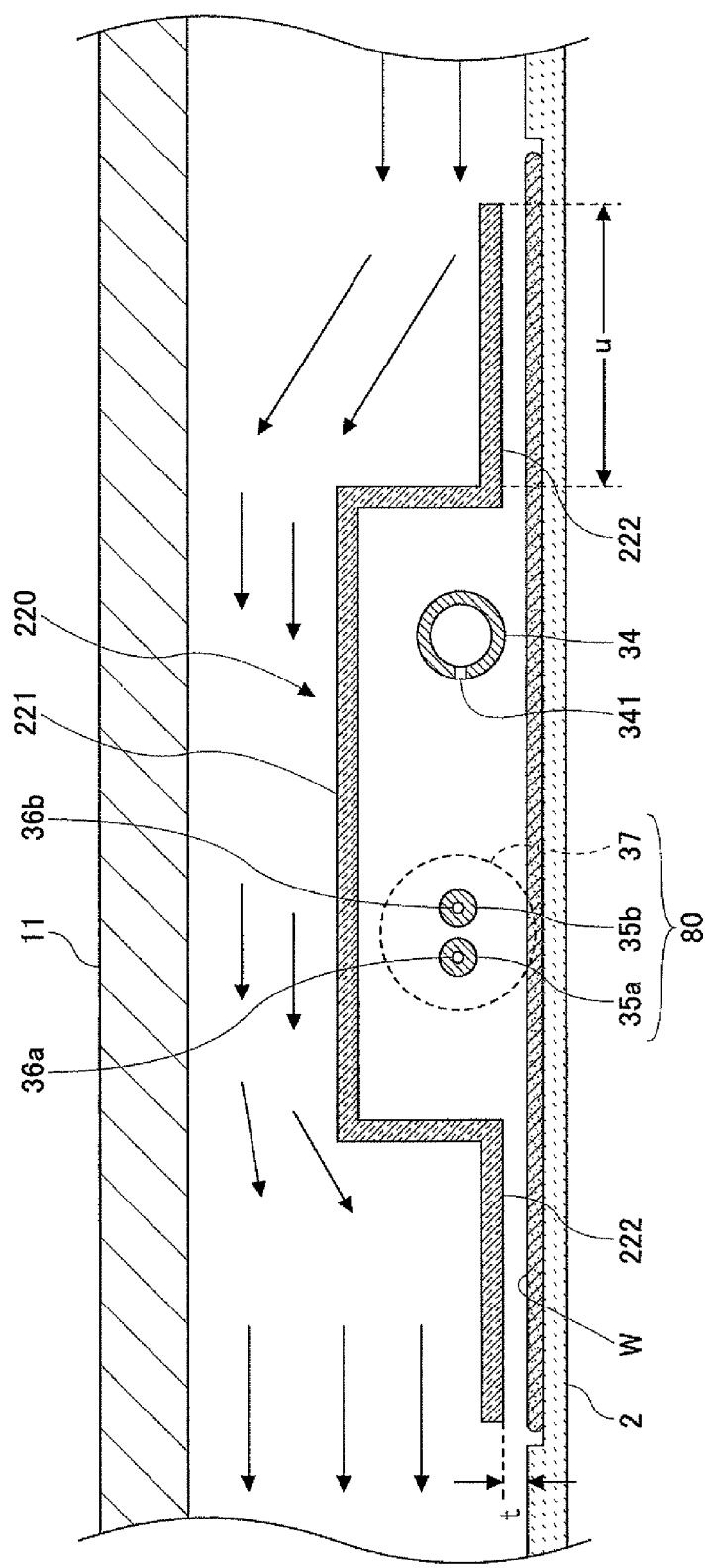
FIG. 7 is a another schematic perspective view illustrating the activated gas supplying part of FIG. 6.

Next, the activated gas injector 220 is described with reference to FIGS. 3, 6, and 7. The activated gas injector 220 is provided in order to supply an activated alteration gas or an etching gas to the film on the wafers W, thereby altering properties of or etching the film. As shown in FIGS. 6 and 7, the activated gas injector 220 includes a gas introduction nozzle 34 serving as a property alteration gas supplying portion, which supplies an alteration gas or an etching gas to the vacuum chamber 1. The gas introduction nozzle 34 has plural gas holes 341 arranged at predetermined intervals along a longitudinal direction of the gas introduction nozzle 34. The gas activation nozzle 34 may be made of, for example, quartz glass. In addition, the activated gas injector 220 has a plasma generation part 80 composed of a pair of sheath pipes 35a, 35b located downstream relative to the rotation direction of the turntable 2 in relation to the gas introduction nozzle 34. The plasma generation part 80 activates the property alteration gas or the etching gas supplied from the gas introduction nozzle 34 into plasma. The sheath pipes 35a, 35b have the same length and are parallel with each other.

The gas introduction nozzle 34 and the plasma generation part 80 extend toward substantially the center of the turntable 2 from the circumferential part of the chamber body 12 and in a direction orthogonal to a tangential direction of the turntable 2. In addition, the gas introduction nozzle 34 and the plasma generation part 80 are parallel with the upper surface of the turntable 2.

As shown in FIG. 3, one end of a gas introduction pipe 271 is connected to the gas introduction nozzle 34, and the other end of the gas introduction pipe 271 is connected to an alteration gas introduction pipe 251 and an etching gas introduction pipe 261. The alteration gas introduction pipe 251 is connected to an alteration gas supplying source 254 that stores the alteration gas via an open/close valve 252 and a flow rate controller 253. As the alteration gas, oxygen ($O_2$) gas or noble gas such as argon (Ar) gas and helium gas, or a gas mixture of $O_2$ gas and the noble gas, the gas mixture including a mixture of $O_2$, Ar, and He, may be used.

In addition, the etching gas introduction pipe 261 is connected to an etching gas supplying source 264 that stores the etching gas via an open/close valve 262 and a flow rate controller 263. As the etching gas, any gas may be used as long as the etching gas can etch a film subject to the etching. In this embodiment, fluorine series gas such as hydrofluorocarbon gas and fluorocarbon gas is used. As the hydrofluorocarbon gas, fluoromethane ($CHF_3$) gas may be used, and as the fluorocarbon gas, tetrafluoromethane ($CF_4$) gas may be used In addition, the plasma generation part 80 includes the sheath pipes 35a, 35b that extend in parallel with each other, and an electrode 36a inserted into the sheath pipe 35a, and an electrode 36b inserted into the sheath pipe 35b. The sheath pipes 35a, 35b may be made of, for example, quartz glass, alumina (aluminum oxide), or yttria (yttrium oxide, $Y_2O_3$). As shown in FIG. 3, a high frequency power source 224 is connected to the electrodes 36a, 36b via a matching box 225. High frequency electric power having a frequency of, for example, 13.56 MHz is applied at, for example, 500 W across the electrodes 36a, 36b from the high frequency supplying source 224. Incidentally, a protection pipe 37 (shown only in FIG. 7) is provided in a base end of the sheath pipes 35a, 35b (inside the vacuum chamber 1). Note that the sheath pipes 35a, 35b are omitted in drawings except for FIG. 7.

As shown in FIGS. 6 and 7, the activated gas injector 220 is provided with a cover body 221 that is arranged to cover the gas introduction nozzle 34 and the sheath pipes 35a, 35b. The cover body 221 may be made, for example, an insulating material such as quartz glass. In addition, the cover body 221 is provided with flow limiting plates 222 that extend in a flange shape in a horizontal direction. Specifically, the flow limiting plates 222 are provided from one end through the other end of the cover body 221 along the longitudinal direction of the cover body 21 and extend outward from corresponding lower edge portions of the cover body 221. The cover body 221 is hung from, for example, the ceiling plate 11 with a hanging member (not shown). A distance t (FIG. 7) between lower surfaces of the flow limiting plates 222 and the upper surface of the turntable 2 is maintained in order to restrict (or efficiently impede) the gases from entering the inside of the cover body 221 from outside. In addition, the flow limiting plate 222 has a width u, which is measured along a direction orthogonal to the radius direction of the turntable 2. The width u becomes wider toward the outer circumference of the turntable 2. Note that the gases in the vacuum chamber 1 flow faster in an outer area than an inner area of the vacuum chamber 1 because of the rotation of the turntable 2. Therefore, the flow limiting plate 222 that becomes wider toward the outer area of the vacuum chamber 1 is advantageous for impeding the gases flowing in the outer area from entering the inside of the cover body 222.

In addition, the film deposition apparatus according to this embodiment is provided with a control part 100 that includes a computer thereby to control total operations of the deposition apparatus. A memory part 101 of the control part 100 stores a computer program that causes the film deposition apparatus to carry out, for example, a film deposition method (described later) under instructions of the control part 100. Such a program includes a group of steps for carrying out the film deposition method and is installed into the control part 100 from a computer readable storage medium 102 such as a hard disk, a compact disc, a magneto optical disk, a memory card, a flexible disk, or the like.

Next, a film deposition method according to an embodiment of the present invention is explained with reference to FIGS. 8A through 10. The film deposition method is carried out in the film deposition apparatus explained above. In the following, $O_3$ gas is used as the oxidization gas supplied from the reaction gas nozzle 32 toward the wafer W; a gas mixture of $O_2$ gas and Ar gas (referred to as $O_2$/Ar gas, hereinafter) is used as the alteration gas supplied from the activated gas injector 220 toward the wafer W; and $CHF_3$ gas is used as the etching gas. In addition, a line-and-space pattern is formed, as shown in Section (a) of FIG. 8A in the wafer W used, and spaces S of the line-and-space is filled with silicon oxide in the following explanation. The space S has convexly curved side walls, so that a width is greater in an area between the bottom and the top of the space S.

(Wafer Transfer-In Step)

First, the turntable 2 is rotated so that the concave portion 24 is in alignment with the transfer opening 15; the gate valve (not shown) is open; and the wafer W is brought into the vacuum chamber 1 through the transfer opening 15 by the transfer arm 10. Then, the wafer W is placed in the concave portion 24 from the transfer arm 10. Then, the series of operations above are repeated five times, and thus five wafers W are loaded on the turntable 2.

(Protection Layer Deposition Step)

Next, the vacuum pump 640 (FIG. 1) is activated in order to activate the vacuum chamber 1 to the lowest reachable pressure. The separation gases ($N_2$) are supplied to the separation areas D through the separation nozzles 41, 42 at predetermined flow rates, and the $N_2$ gas is supplied from the separation gas supplying pipe 51 and the purge gas supplying pipes 72, 73 at predetermined flow rates. Then, a pressure inside the vacuum chamber 1 is maintained at a predetermined pressure by the pressure controller 650. Next, the turntable 2 starts rotating clockwise when seen from above at a rotational speed of, for example, 20 revolutions per minute (rpm). The turntable 2 is heated to a predetermined temperature, for example, 450° C. in advance by the heater unit 7, which in turn heats the wafers W on the turntable 2.

Subsequently, the silicon-containing gas and the $O_3$ gas are supplied from the first reaction gas nozzle 31 and the second reaction gas nozzle 32, respectively. In addition, only the $O_2$/Ar gas is supplied from the gas introduction nozzle 34 of the activated gas injector 220, and high frequency power having a frequency of 13.56 MHz is supplied at, for example, 400 W across the electrodes 36a, 36b. With this, oxygen plasma is generated in the inner space of the cover body 221 of the activated gas injector 220 (or in the vicinity of the plasma generation part 80).

Due to the rotation of the turntable 2, the wafer W passes through the first process area P1, the separation area D, the second process area P2, an alteration area 150 (an area shown in FIG. 2 below the activated gas injector 220), and the separation area D (see FIG. 3). In the first process area P1, the silicon-containing gas is adsorbed on the upper surface of the wafer W and the inner side walls and the bottoms of the spaces S, as shown in Section (b) of FIG. 8A, so that a silicon-containing gas molecule layer 61 is formed. In the second process area P2, the silicon-containing gas adsorbed on the upper surface of the wafer W and the inner side walls and the bottoms of the spaces S is oxidized by the $O_3$ gas, so that a silicon oxide film 62 having one or more layers of silicon oxide is deposited, as shown in Section (c) of FIG. 8A.

The silicon oxide film 62 may contain impurities such as moisture (or OH group) and organic substances, which may originate from the silicon-containing gas. However, when the wafer W reaches the alteration area 150, the silicon film 62 can be altered by the oxygen plasma. Specifically, when the silicon oxide film 62 is exposed to the oxygen plasma, the organic substances remaining in the silicon oxide film 61 can be oxidized, and the oxidized substances are discharged in gaseous phase thereby being evacuated from the vacuum chamber 1. In addition, when high energy particles in the oxygen plasma bombard the silicon oxide film 62, the silicon and/or oxygen atoms of the silicon oxide film 62 can be rearranged by bombardment of the high energy particles, so that the silicon oxide becomes densely packed. In such a manner, the silicon oxide film 62 can be deposited and altered, so that a high quality silicon oxide film 63 (Section (d) of FIG. 8A) is obtained during every rotation of the turntable 2. Next, after the turntable 2 is rotated predetermine times, the silicon oxide film 63 has a predetermined thickness of, for example, 5 nm to 10 nm. The silicon oxide film 63 having such thickness serves as a protection layer that protects the upper surface of the wafer W and the inner side walls and the bottoms of the spaces S from the etching gas to be supplied afterward.

(First Step)

Figure 8A:
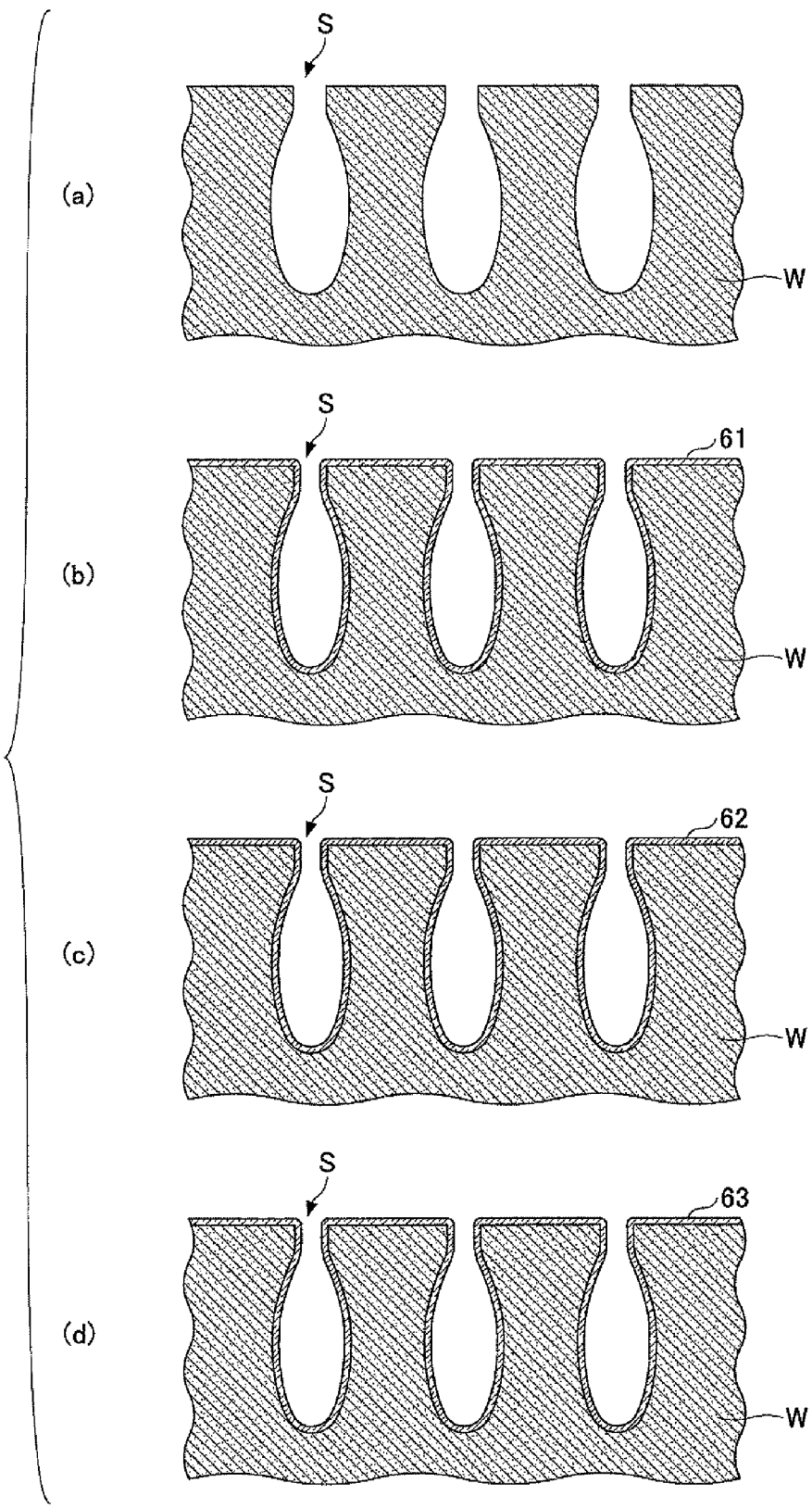
FIG. 8A is an explanatory view for explaining a film deposition method according to an embodiment of the present invention.

Next, the $CHF_3$ gas in addition to the $O_2$/Ar gas is supplied from the gas introduction nozzle 34 of the activated gas injector to the alteration area 150, and the adsorption of the silicon-containing gas, the oxidation of the silicon-containing gas by the $O_3$ gas, and the alteration of the deposited silicon oxide, which have been explained with reference to Sections (a) through (d) of FIG. 8A, are repeated by rotating the turntable 2. In this case, because the $CHF_3$ gas is also activated by the high frequency power supplied across the electrodes 36a, 36b, the silicon oxide film 62 (or 63) is etched in the alteration area 150 at the same time the silicon oxide film 62 is altered into the high quality silicon oxide film 62. In other words, the deposition of the silicon oxide film 62 (or 63) and the etching of the deposited silicon oxide film 62 (or 63) are concurrently carried out so that a deposition rate becomes greater than an etching rate in the first step. In addition, film deposition conditions such as the flow rate of the $CHF_3$ gas, the pressure inside the vacuum chamber 1, and a high frequency power are determined so that the etching rate becomes greater near upper parts of the spaces S than in area near the bottoms of the spaces S (or so that the film deposition rate becomes less near the upper parts of the spaces S than in area near the bottoms of the spaces S). According to such conditions, which may be determined through, for example, preliminary experiments, the upper parts of the spaces S cannot be closed by the deposited silicon oxide, so that that the film deposition can be continuously carried out.

(Second Step)

Figure 8B:
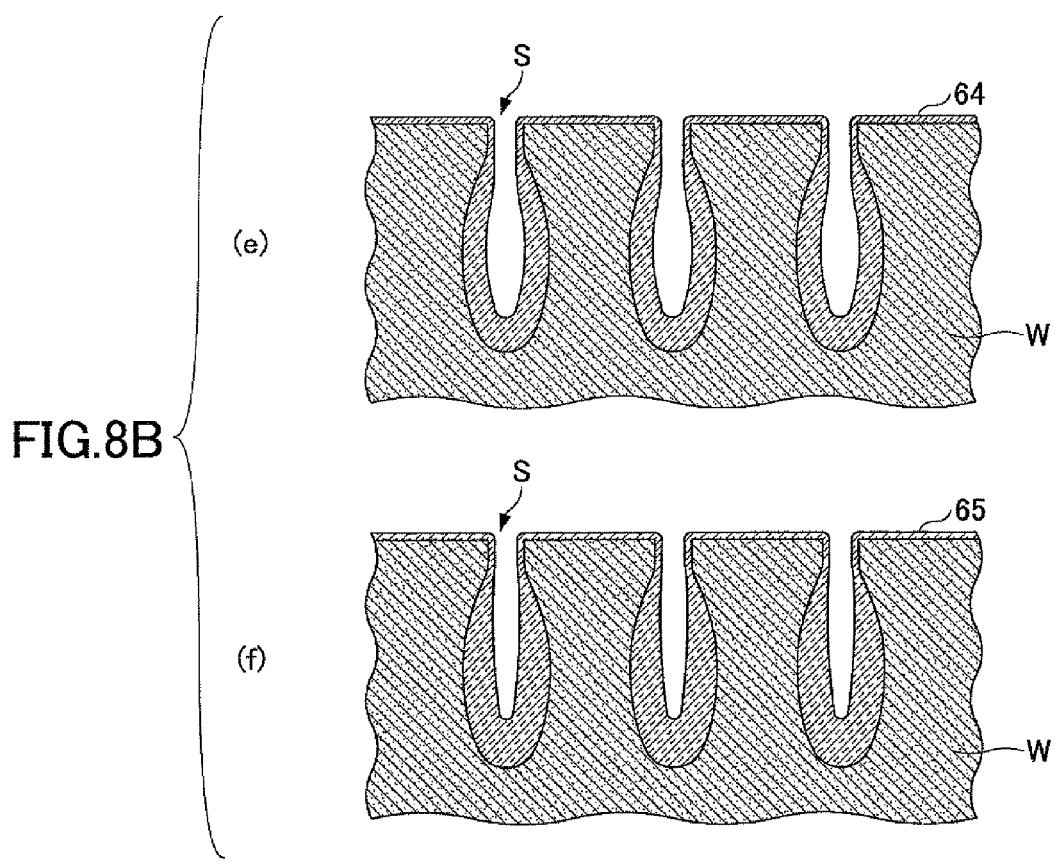
FIG. 8B is another explanatory view for explaining a film deposition method according to an embodiment of the present invention, following FIG. 8A.
Figure 8C:
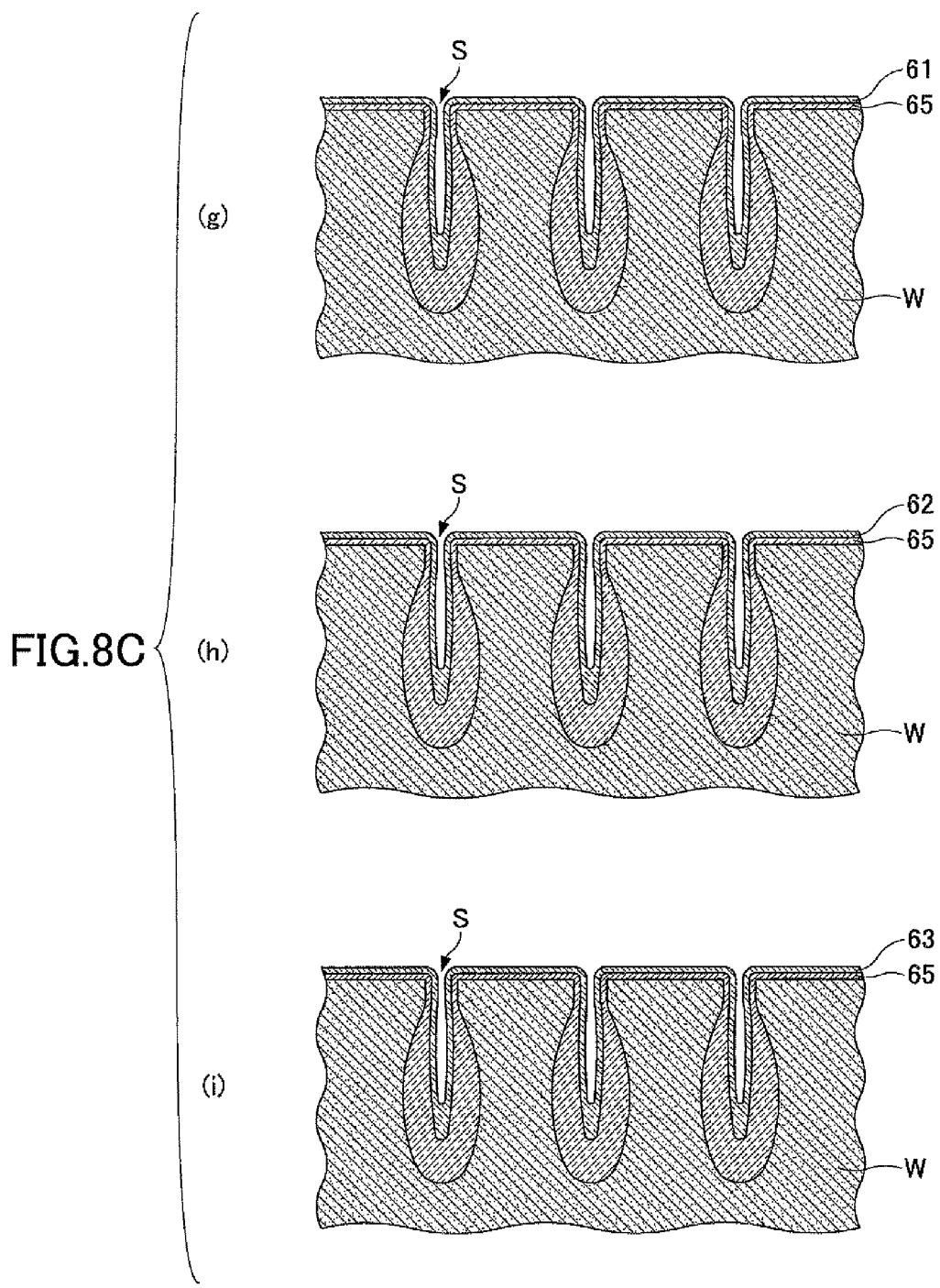
FIG. 8C is another explanatory view for explaining a film deposition method according to an embodiment of the present invention, following FIG. 8B.

When the number of the rotations of the turntable 2 reaches the predetermined number, a silicon oxide film deposited on the side walls and the bottoms of the spaces has a cross-sectional shape as shown in Section (e) of FIG. 8B. In other words, a silicon oxide film 64 is thicker in the bottoms of the spaces S than near the upper parts of the spaces S and the upper surfaces of the wafer W. In addition, the silicon oxide film 64 has slightly concavely curved side walls. Note that curvatures of the side walls of the silicon oxide film 64 are alleviated compared to those of the side walls of the spaces S.

Next, while continuing rotating the turntable 2, heating the wafers W, supplying the $O_3$ gas from the reaction gas supplying portion 32, supplying the $O_2$/Ar gas and the $CHF_3$ gas from the gas introduction nozzle 34 of the activated gas injector 220, and supplying high frequency power across the electrodes 36a, 36b under the same condition as those in the first step, the silicon-containing gas is stopped being supplied from the reaction gas supplying portion 31. Therefore, the silicon oxide film is not deposited, but the etching of the deposited silicon oxide film 64 is continued. Because the etching rate of the silicon oxide film 64 is greater in the upper parts of the spaces S than in the bottoms of the spaces S, the silicon oxide film 64 is turned into a silicon oxide film 65 shown in Section (f) of FIG. 8B, after a predetermined period of time has elapsed. Namely, the silicon oxide film 65 has a tapered opening that is wider at the upper part thereof and becomes narrower toward the bottom of the space S. Incidentally, the period of time is determined in order not to allow the upper surface of the wafer W and the upper parts of the spaces S to be exposed, and may be determined through a preliminary experiment.

(Third Step)

Figure 8D:
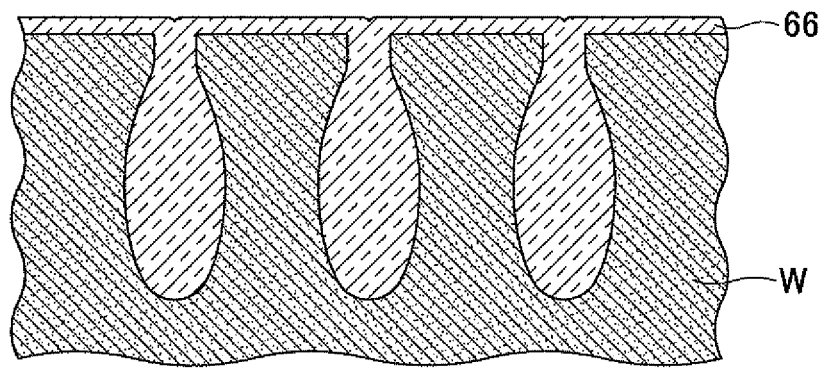
FIG. 8D is another explanatory view for explaining a film deposition method according to an embodiment of the present invention, following FIG. 8C.

Next, supplying the silicon-containing gas from the reaction gas supplying portion 31 is resumed at a third step. With this, the deposition of silicon oxide and the etching of the deposited silicon oxide are concurrently carried out in the same manner as the first step. Namely, when the wafer W passes through the first process area P1, the silicon-containing gas is adsorbed on surfaces of the tapered openings of the spaces S, and thus the silicon-containing-gas layer 61 is formed as shown in Section (g) of FIG. 8C. Then, when the wafer W passes through the second process area P2, the silicon-containing gas layer 61 is oxidized by the $O_3$ gas to be the silicon oxide film 62. The silicon oxide film 62 is altered and etched when the wafer W passes through the alteration area 150, so that the silicon oxide film 63 is obtained. When the third step is continued, the side wall parts of the silicon oxide film 63 in the space S come close to each other so that a taper angle (opening angle) of the tapered opening becomes greater. In other words, the space S is filled with the silicon oxide film 63 so that the bottom part of the silicon oxide film 63 becomes thicker. After a predetermined period of time has elapsed, the spaces S are filled with a silicon oxide film 66 without voids, as shown in FIG. 8D.

Subsequently, supplying the silicon-containing gas from the reaction gas nozzle 31, supplying the $O_3$ gas from the reaction gas nozzle 32, supplying the $O_2$/Ar gas and the $CHF_3$ gas from the gas introduction nozzle 34 of the activated gas injector 220, and supplying the high frequency power across the electrodes 36a, 36b are stopped, and the vacuum chamber 1 is purged with $N_2$ gas. Then, the wafers W are transferred out from the vacuum chamber 1 according to procedures opposite to those when the wafers W are transferred into the vacuum chamber 1. With this, the film deposition method of the silicon oxide film is completed.

As stated above, the wafer W passes through the first process area P1 where the silicon-containing gas is supplied from the reaction gas nozzle 31, the second process area 22 where the $O_3$ gas is supplied, and the process area 150 where the oxygen plasma and the activated CHF 3 gas is supplied, due to the rotation of the turntable 2 in the film deposition apparatus where the reaction gas nozzle 31, the reaction gas nozzle 32, and the activated gas injector 220 are provided. Therefore, the silicon-containing gas adsorbed on the wafer W having the line-and-space pattern in the first process area 21 is oxidized by the $O_3$ gas in the second process area P2 thereby depositing the silicon oxide film 62 on the wafer W. The deposited silicon oxide film 62 is then altered by the oxygen plasma and etched by the activated $CHF_3$ gas in the process area 150 (first step), thereby obtaining the silicon oxide film 63. In this case, because the deposition rate of the silicon oxide film 63 is greater near the bottom of the space S and smaller near the upper part of the space S, the opening of the space S is not likely to be closed by the silicon oxide deposited thereon. Although if the opening is closed before the space S is filled with the silicon oxide, there remains a void within the closed space S, such a void is not likely to be formed according to the embodiment of the present invention.

In addition, the silicon oxide film 63 is only etched in the second step because the silicon-containing gas is not used in this step. Therefore, a cross-sectional shape of the space S becomes tapered. Specifically, the opening of the space S is wider along a direction from the bottom to the upper part of the space S (Section (f) of FIG. 8B). Subsequently, the third step, which is the same as the first step, is carried out, so that the space S is filled with the silicon oxide film so that the silicon oxide film deposited on the bottom of the space S becomes thicker.

If the ALD of the silicon oxide film is carried out in order to fill a space of the line-and-space pattern, a surface of the silicon oxide film deposited on one side wall of the space S and a surface of the silicon oxide film deposited on the opposite side wall of the same space S come closer to each other as the silicon oxide film becomes thicker. At a time right before the two surfaces come in contact with each other, there is only a slight gap therebetween, which impedes by-products of the silicon-containing gas and the $O_3$ gas from being evacuated out through the gap to the inner space of the vacuum chamber 1. Therefore, the by-products may be incorporated in the silicon oxide film, and specifically, highly concentrated at a boundary (seam) between the two surfaces. In addition, there may be high concentrated crystalline defects at the seam because chemical bonds may not be formed between silicon atoms and oxygen atoms when the two surfaces come in contact with each other. Namely, the film properties may be degraded at the seam of the silicon oxide film. In this case, a problem may be caused that the seam may be excessively etched in a subsequent etching process for the silicon oxide film.

However, the seam, which is created because the silicon oxide films deposited on the side walls of the space S come in contact with each other, is not likely to be created according to the embodiment. Therefore, property degradations along the seam or its vicinity are prevented.

In addition, because the film deposition method according to the embodiment is carried out in the film deposition apparatus according to the embodiment of the present invention that is provided with the reaction gas nozzle 31, the reaction gas nozzle 32, and the activated gas injector 220 in the same vacuum chamber 1, deposition of the silicon oxide film, alteration of the deposited silicon oxide film, and etching of the deposited silicon oxide film are carried out in the same vacuum chamber 1. Therefore, production throughput can be improved compared to a case where deposition and etching are carried out in different apparatuses, because no wafer transferring time is needed in the film deposition apparatus according to the embodiment.

Moreover, the silicon oxide film can be exposed to the activated alteration gas after the silicon oxide film is deposited through adsorption of the silicon-containing gas and oxidation of the adsorbed silicon-containing gas by the $O_3$ gas. Therefore, the activated alteration gas can affect the silicon oxide film having a thickness of a monomolecular level, and thus the silicon oxide film can be efficiently altered.

Figure 9:
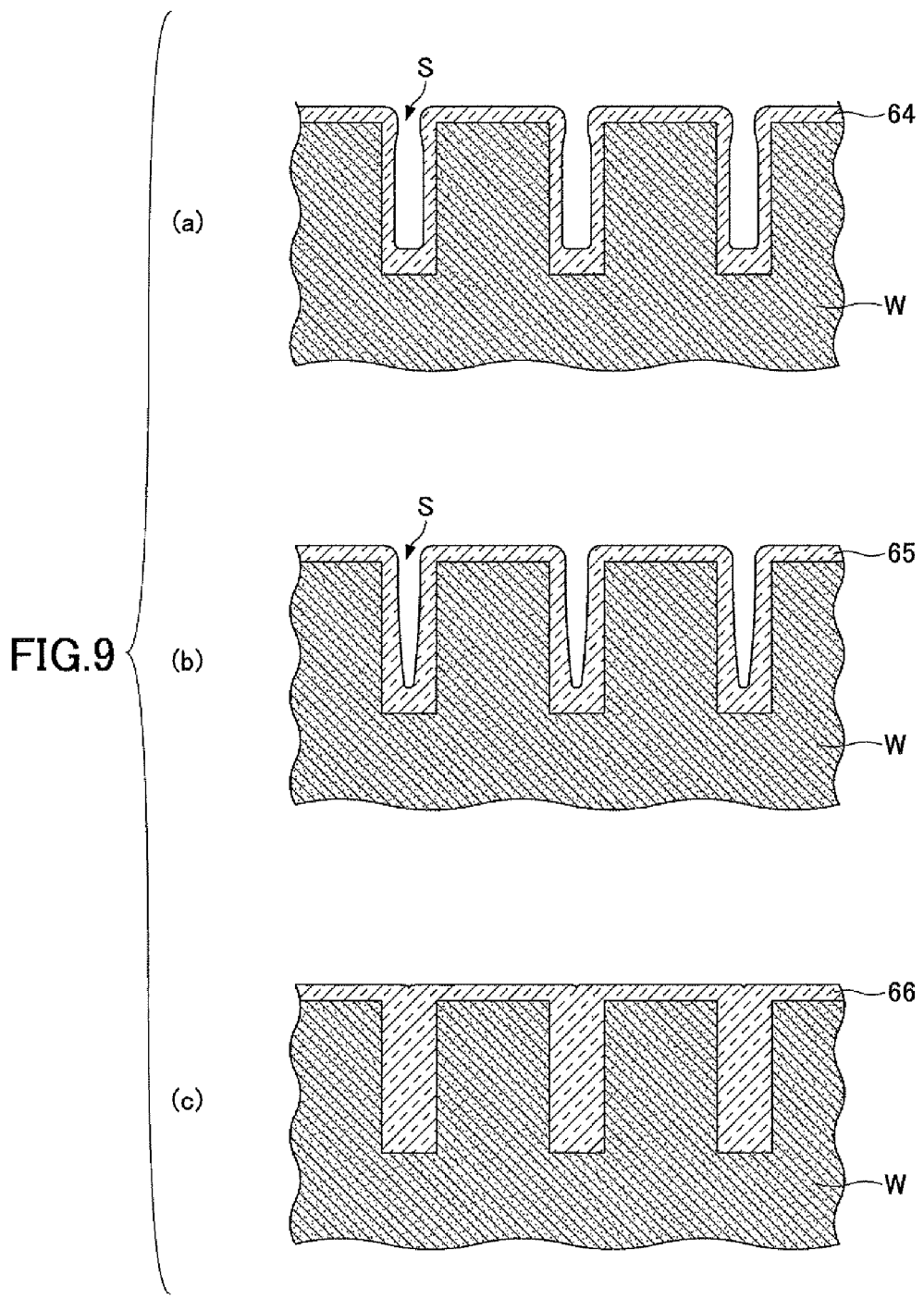
FIG. 9 is an explanatory view for explaining another embodiment of the film deposition apparatus according to the present invention.

Incidentally, the film deposition method according to the embodiment of the present invention has been explained taking an example of the wafer W where the spaces S having concavely curved side walls (see Section (a) of FIG. 8A) are formed, with reference to FIGS. 8A through 8D. However, a film deposition method according to an embodiment of the present invention is applicable to a wafer where spaces S having rectangular cross-sectional shape are formed, as shown in FIG. 9. Namely, the wafer transfer-in step and the first step explained above are carried out with respect to the wafer W with the spaces S having the rectangular cross-sectional shape, and thus the silicon oxide film 64 having a predetermined thickness is obtained (Section (a) of FIG. 9). The silicon oxide film 64 has been altered so that film properties are improved by the activated alteration gas.

Next, when the second step is carried out, the cross-sectional shape of the spaces S becomes tapered. In other words, the opening of the space S, defined by the silicon oxide film 65, becomes wider toward the upper part of the space S, as shown in Section (b) of FIG. 9. Then, the third step is carried out, and then the first, the second, and the third steps are repeated in this order predetermined times. As a result, the spaces S can be filled with the silicon oxide film 66 without a void, as shown in Section (c) of FIG. 9.

Furthermore, a space having an inversely tapered opening that becomes wider toward the bottom of the space can be filled with silicon oxide according to the film deposition method according to the embodiment. Namely, the wafer transfer-in step and the first step explained above are carried out with respect to the wafer W with the spaces S having the inversely tapered opening, and thus the silicon oxide film 64 having a predetermined thickness is obtained (Section (a) of FIG. 10). Because the silicon oxide film 64 has been etched by the etching gas supplied from the activated gas injector 220, the silicon oxide film 64 becomes thinner in the upper parts of the spaces S than in the bottoms of the spaces S, so that the cross-sectional shapes of the spaces S, defined by the silicon oxide film 64, are more nearly rectangular compared to the spaces S formed in the wafer W.

Figure 10:
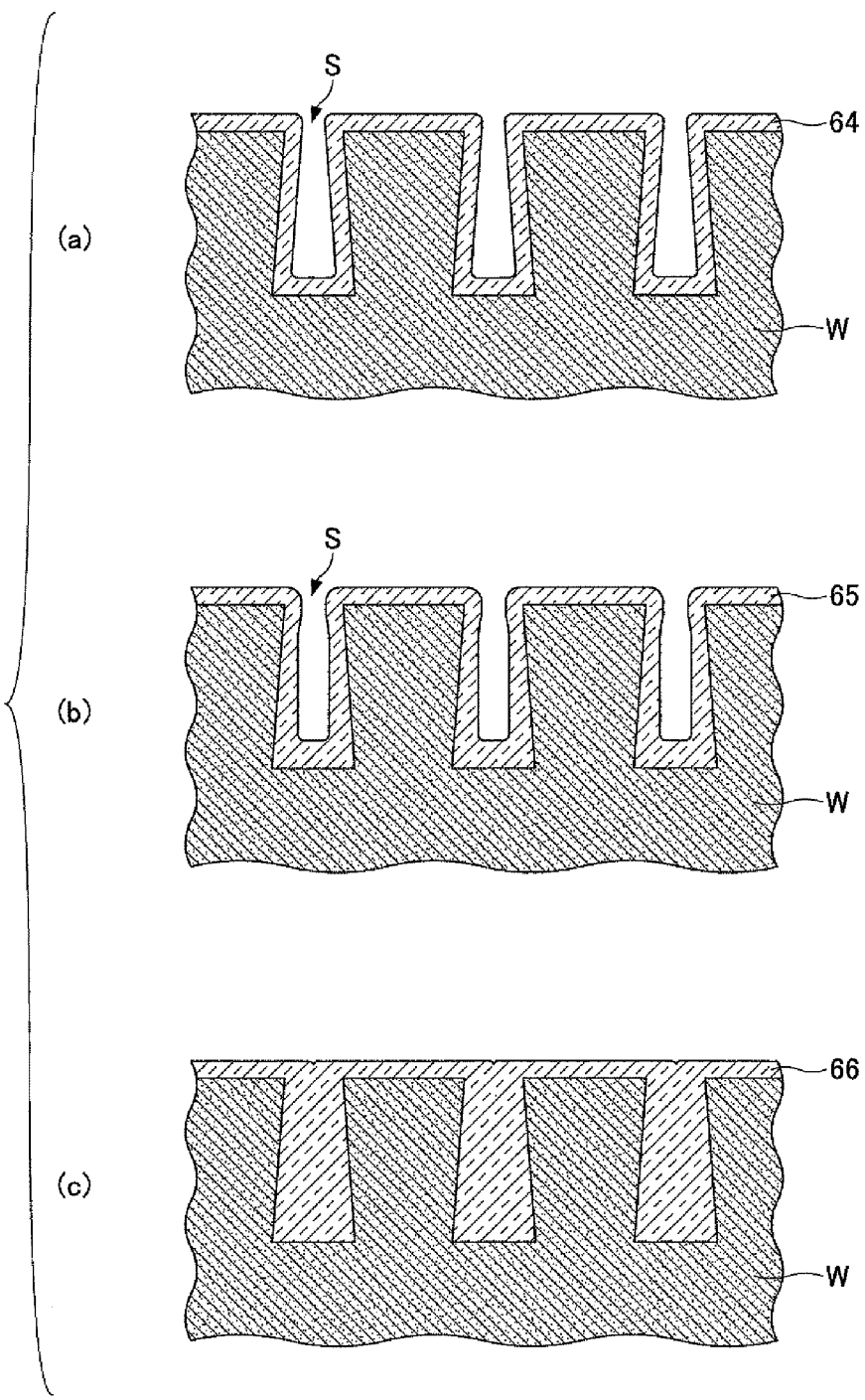
FIG. 10 is an explanatory view for explaining yet another embodiment of the film deposition apparatus according to the present invention.

Next, when the second step explained above is carried out, the cross-sectional shape of the spaces S defined by the silicon oxide film 65 can become substantially rectangular, as shown in Section (b) of FIG. 10, because the upper part of the silicon oxide film 64 is etched to a greater extent than the bottom of the spaces S. Such a substantially rectangular cross-sectional shape is substantially the same as the spaces S explained with reference to FIG. 9. Therefore, when the film deposition method explained with reference to FIG. 9 is carried out afterward, the spaces S are filled with a silicon oxide film 66 without voids, as shown in Section (c) of FIG. 10.

Here, an example of deposition conditions preferable in each step of the film deposition method according to this embodiment is listed below. However, the below-listed deposition conditions do not limit the present invention. The deposition conditions to be used may be arbitrarily determined in accordance with a size or shape of a film deposition apparatus used, a material to be deposited, reaction gases used, an alteration gas used, an etching gas used, and the like.

(1) Protection Layer Deposition Step
Rotational speed of the turntable 2: 1 through 500 rpm (when a wafer having a diameter of 300 mm is used.)
Pressure in the vacuum chamber 1: 133 Pa (1 Torr)
Flow rate of the silicon-containing gas from the reaction gas nozzle 31: 100 sccm
Flow rate of the $O_3$ gas from the reaction gas nozzle 32: 10000 sccm
Flow rate of the $O_2$/Ar gas from the activated gas injector 220: 10000 sccm
High frequency power supplied to the activated gas injector 220: 500 through 900 W (frequency: 13.56 MHz)

(2) First Step and Third Step
Flow rate of the $CHF_3$ gas from the activated gas injector 220: 0.5 through 3 sccm
(Other conditions are the same as those in the protection layer deposition step.)

(3) Second Step
Flow rate of the silicon-containing gas from the reaction gas nozzle 31: 0 sccm
(Other conditions are the same as those in the protection layer deposition step.)

Although the invention has been described in conjunction with the foregoing specific embodiments, many alterations and modifications will be apparent to those skilled in the art. Those alterations and modifications are intended to fall within the spirit and scope of the appended claims.

For example, when a space has a cross-sectional shape that becomes wider along a direction from the bottom to the upper part of the space, the space may be filled with silicon oxide by carrying out only the first step where depositing silicon oxide film and etching the deposited silicon oxide film are concurrently carried out (altering the deposited silicon oxide film may be included in the first step). In addition, such a space may be filled only by carrying out the deposition of the silicon oxide film in the first step and the third step, and etching of the deposited silicon oxide film in the second step.

In addition, an additional plasma generation part 80 may be provided in the vacuum chamber 1.

Moreover, while the plasma generation part 80 is configured as a capacitive coupling plasma generation part where the parallel electrodes (the electrodes 36a, 36b) are used in the above embodiment, an inductive coupling plasma generation part employing an inductive coil may be used as the plasma generation part 80.

Furthermore, the protection layer deposition step is explained in the above embodiment; when the inner surface of the space S is not eroded by the activated alteration gas and/or the etching gas in the first step, the protection layer deposition step may be omitted. For example, when the inner surface of a space formed in a silicon substrate is covered by, for example, a silicon nitride film, the film deposition method according to an embodiment of the present invention may be started from the first step without the protection layer deposition step.

In the second step, the silicon-containing gas is not supplied thereby stopping deposition of the silicon oxide film in the above embodiment. Because a flow rate of the silicon-containing gas is relatively extremely less than a flow rate of the $O_3$ gas as listed above, even when the silicon-containing gas is stopped, the pressure inside the vacuum chamber 1 is not significantly changed, which is advantageous in that gas flow patterns in the vacuum chamber 1 are not significantly changed. Note that gas flow pattern changes in the vacuum chamber 1 may affect (across-a-wafer or wafer-to-wafer) film thickness and/or film property uniformity. Therefore, it is advantageous that supplying the silicon-containing gas is stopped in order to stop the deposition of the silicon oxide film. However, in other embodiments, the $O_3$ gas may be stopped thereby stopping the deposition of the silicon oxide film, especially when the $O_3$ gas is supplied at a relatively lower flow rate. In addition, $N_2$ gas or noble gas may be supplied from, for example, the reaction gas nozzle 31 instead of the silicon-containing gas, when the silicon-containing gas is stopped in the second step.

While in the above embodiment the turntable 2 is rotated with respect to a gas supplying mechanism (the nozzles 31 to 34, 41, 42, 220), in other embodiments the gas supplying mechanism may be rotated with respect to the turntable 2.

In addition, while a case where the two reaction gases (the silicon-containing gas and the oxidation gas) are used to form the reaction product is explained in the above examples, the present invention may be applied to a case where more than two reaction gases, for example, three or four reaction gases, may be used to form a reaction product.

The silicon-containing gas that may be used in the film deposition of silicon oxide according to an embodiment of the present invention includes a bis(tertiary-butylamino) silane (BTBAS) gas, dichlorosilane (DOS), hexachlorodisilane (HOD), tris(dimethyl amino) silane (3DMAS), monoaminosilane, or the like. In addition, trimethyl aluminum (TMA), tetrakis-ethyl-methyl-amino-zirconium (TEMAZ), tetrakis-ethyl-methyl-amino-hafnium (TEMAH), bis(tetra methyl heptandionate) strontium (Sr(THD)2), (methyl-pentadionate)(bis-tetra-methyl-heptandionate) titanium (Ti(MPD)(THD)), monoamino-silane, or the like may be used as a first reaction gas, so that an aluminum oxide film, a zirconium oxide film, a hafnium oxide film, a strontium oxide film, a titanium oxide film or the like may be deposited, respectively. Moreover, as the oxidation reaction gas that oxidizes the above reaction gases, moisture vapor may be used instead of the $O_3$ gas. Furthermore, when obtaining a TiN film according to an embodiment of the present invention, where the oxidization gas is not used, a nitrogen-containing gas such as ammonia ($NH_3$) gas may be used as a second reaction gas supplied from the reaction gas nozzle 32 and an alteration gas supplied from the gas introduction nozzle 34 of the activated gas injector 220. Moreover, the alteration gas and the etching gas may be determined depending on a material of a film to be deposited.

In addition, the separation gas is not limited to the $N_2$ gas, but noble gas such as Ar gas and He gas may be used.

The film deposition method according to an embodiment of the present invention can be applied to a wafer where trenches are formed. In addition, the line-and-space pattern may be formed by a metal layer.

What is claimed is:

1. A film deposition method comprising steps of:
    transferring a plurality of substrates, each having a pattern including a concave part therein, into a vacuum chamber and placing the plurality of substrates on a turntable in the vacuum chamber along a circumferential direction of the turntable at equal angular intervals;
    supplying a first reaction gas to the plurality of the substrates in the vacuum chamber from a first reaction gas supplying part, thereby allowing the first reaction gas to be adsorbed on the plurality of the substrates;
    supplying a second reaction gas that reacts with the first reaction gas to the plurality of the substrates in the vacuum chamber from a second reaction gas supplying part, thereby allowing the first reaction gas adsorbed on the plurality of the substrates to react with the second reaction gas and thus forming a reaction product of the first reaction gas and the second reaction gas on the substrate;
    supplying an alteration gas to the plurality of the substrates in the vacuum chamber through an activated gas supplying part that is capable of activating the alteration gas, thereby altering properties of the reaction product on the plurality of the substrates; and
    supplying an etching gas to the substrate in the vacuum chamber through the activated gas supplying part under an environment where the reaction product is not being formed, thereby etching the reaction product,
    wherein the etching gas is supplied in addition to the alteration gas to the plurality of the substrates in the vacuum chamber through the activated gas supplying part, thereby performing alteration of the reaction product and etching of the reaction product in the step of supplying the alteration gas, and
    wherein the forming and the etching of the reaction product are performed continuously and repeatedly on each of the plurality of the substrates on the turntable in the vacuum chamber.

2. The film deposition method of claim 1, wherein the step of supplying the first reaction gas, the step of supplying the second reaction gas, and the step of supplying the alteration gas are repeated in this order one or more times before the step of supplying the etching gas.

3. The film deposition method of claim 1, wherein the step of supplying the first reaction gas, the step of supplying the second reaction gas, and the step of supplying the alteration gas are repeated in this order one or more times after the step of supplying the etching gas.

4. The film deposition method of claim 1, wherein the alteration gas is activated by high frequency power in the step of supplying the alteration gas.

5. The film deposition method of claim 1, wherein the etching gas is activated by high frequency power in the step of supplying the etching gas.

6. The film deposition method of claim 1, wherein the activated gas supplying part is provided with a cover body for covering the activated gas supplying part, said cover body including a flow limiting plate that extends in a direction parallel to the turntable and has a width that becomes wider toward an outer circumference of the turntable.

7. A film deposition method comprising steps of:
transferring a plurality of substrates, each having a pattern including a concave part therein, into a vacuum chamber and placing the plurality of the substrates on a turntable in the vacuum chamber along a circumferential direction of the turntable at equal angular intervals;
supplying a first reaction gas to the plurality of the substrates in the vacuum chamber from a first reaction gas supplying part, thereby allowing the first reaction gas to be adsorbed on the plurality of the substrates;
supplying a second reaction gas that reacts with the first reaction gas to the plurality of the substrates in the vacuum chamber from a second reaction gas supplying part, thereby allowing the first reaction gas adsorbed on the plurality of the substrates to react with the second reaction gas and thus forming a reaction product of the first reaction gas and the second reaction gas on the plurality of the substrates; and
supplying an alteration gas and an etching gas to the substrate in the vacuum chamber through an activated gas supplying part that is capable of activating the alteration gas, thereby altering properties of the reaction product and etching the reaction product on the plurality of the substrates,
wherein the forming and the etching of the reaction product are performed continuously and repeatedly on each of the plurality of the substrates on the turntable in the vacuum chamber.

8. The film deposition method of claim 7, further comprising another step of supplying an etching gas to the substrate in the vacuum chamber through the activated gas supplying part under an environment where the reaction product is not being formed, thereby etching the reaction product.

9. The film deposition method of claim 8, wherein the step of supplying the first reaction gas, the step of supplying the second reaction gas, and the step of supplying the alteration gas and the etching gas are repeated in this order one or more times before the another step of supplying etching gas.

10. The film deposition method of claim 8, wherein the step of supplying the first reaction gas, the step of supplying the second reaction gas, and the step of supplying the alteration gas and the etching gas are repeated in this order one or more times after the step of supplying etching gas.

11. The film deposition method of claim 8, wherein the etching gas is activated by high frequency power in the another step of supplying the etching gas.

12. The film deposition method of claim 7, wherein the etching gas is activated by high frequency power in the step of supplying the alteration gas and the etching gas.

* * * * *